United States Patent
Palm et al.

(10) Patent No.: US 9,768,037 B2
(45) Date of Patent: Sep. 19, 2017

(54) ELECTRONIC DEVICE PACKAGE INCLUDING METAL BLOCKS

(71) Applicant: Infineon Technologies AG, Neubiberg (DE)

(72) Inventors: Petteri Palm, Regensburg (DE); Edward Fuergut, Dasing (DE); Irmgard Escher-Poeppel, Duggendorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/279,752

(22) Filed: May 16, 2014

(65) Prior Publication Data

US 2015/0332938 A1 Nov. 19, 2015

(51) Int. Cl.
*H01L 23/538* (2006.01)
*H01L 21/56* (2006.01)
*H01L 21/78* (2006.01)
*H01L 25/065* (2006.01)
*H01L 23/31* (2006.01)

(Continued)

(52) U.S. Cl.
CPC ............ *H01L 21/561* (2013.01); *H01L 21/56* (2013.01); *H01L 21/6835* (2013.01); *H01L 21/78* (2013.01); *H01L 23/3107* (2013.01); *H01L 23/4334* (2013.01); *H01L 23/49822* (2013.01); *H01L 23/49827* (2013.01); *H01L 23/538* (2013.01); *H01L 23/5389* (2013.01); *H01L 23/552* (2013.01); *H01L 24/19* (2013.01); *H01L 24/24* (2013.01); *H01L 24/25* (2013.01); *H01L 24/82* (2013.01); *H01L 24/96* (2013.01); *H01L 24/97* (2013.01); *H01L 25/0655* (2013.01); *H01L 21/568* (2013.01); *H01L 23/3128* (2013.01); *H01L 23/49816* (2013.01); *H01L 2221/68318* (2013.01); *H01L 2221/68372* (2013.01); *H01L 2224/04105* (2013.01); *H01L 2224/12105* (2013.01); *H01L 2224/2518* (2013.01); *H01L 2924/13055* (2013.01);

(Continued)

(58) Field of Classification Search
CPC ............... H01L 25/043; H01L 25/0657; H01L 25/0756; H01L 23/4012; H01L 23/538; H01L 23/5389; H01L 23/3107; H01L 23/3114

See application file for complete search history.

(56) References Cited

U.S. PATENT DOCUMENTS 5,157,475 A * 10/1992 Yamaguchi ............. H01L 21/56
257/679
6,821,821 B2 * 11/2004 Fjelstad ............... H01L 21/4832
257/E21.502

(Continued)

FOREIGN PATENT DOCUMENTS

WO WO 2013/100709 A1 * 7/2013

Primary Examiner — Phat X Cao
(74) Attorney, Agent, or Firm — Murphy, Bilak & Homiller, PLLC

(57) ABSTRACT

A method of manufacturing an electronic device package includes structuring a metal layer to generate a structured metal layer having a plurality of openings. Semiconductor chips are placed into at least some of the openings. An encapsulating material is applied over the structured metal layer and the semiconductor chips to form an encapsulation body. The encapsulation body is separated into a plurality of electronic device packages.

7 Claims, 11 Drawing Sheets

(51) Int. Cl.
*H01L 23/433* (2006.01)
*H01L 23/552* (2006.01)
*H01L 21/683* (2006.01)
*H01L 23/00* (2006.01)
*H01L 23/498* (2006.01)

(52) U.S. Cl.
CPC .............. *H01L 2924/13091* (2013.01); *H01L 2924/18162* (2013.01)

(56) References Cited

U.S. PATENT DOCUMENTS

| | | | | |
|---|---|---|---|---|
| 7,060,535 | B1 * | 6/2006 | Sirinorakul | H01L 21/4832 257/702 |
| 8,058,101 | B2 * | 11/2011 | Haba | G01R 31/2886 257/678 |
| 2011/0127654 | A1 * | 6/2011 | Weng | H01L 21/568 257/660 |
| 2012/0267765 | A1 * | 10/2012 | Chen | H01L 21/486 257/620 |
| 2013/0256914 | A1 * | 10/2013 | Cheng | H01L 24/81 257/777 |
| 2014/0151859 | A1 * | 6/2014 | Kim | H01L 23/552 257/659 |
| 2014/0159251 | A1 * | 6/2014 | Marimuthu | H01L 24/19 257/774 |
| 2014/0353823 | A1 * | 12/2014 | Park | H01L 23/3128 257/737 |
| 2014/0353838 | A1 * | 12/2014 | Lin | H01L 24/97 257/773 |
| 2014/0367848 | A1 * | 12/2014 | Chi | H01L 23/49822 257/737 |
| 2015/0014828 | A1 * | 1/2015 | Kuo | H01L 23/535 257/659 |
| 2015/0108621 | A1 * | 4/2015 | Pabst | H01L 23/49811 257/659 |
| 2015/0200185 | A1 * | 7/2015 | Yu | H01L 25/0657 257/737 |

* cited by examiner

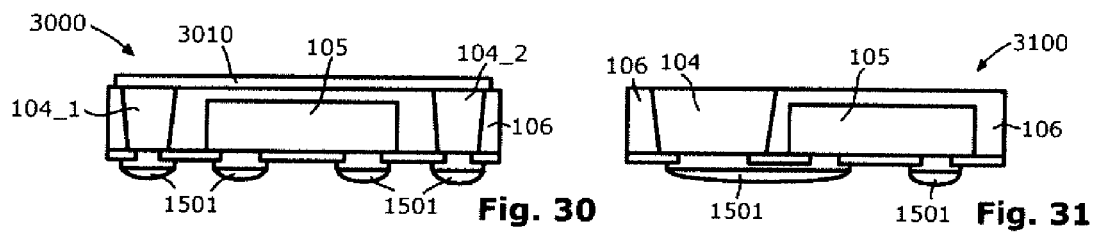
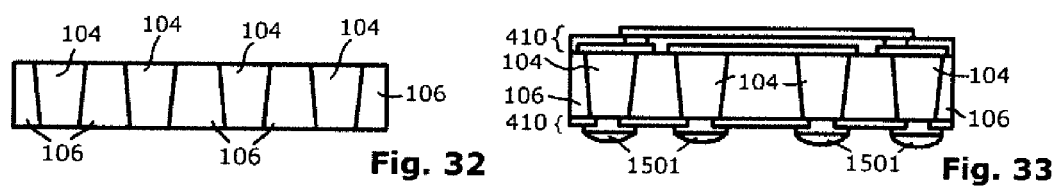
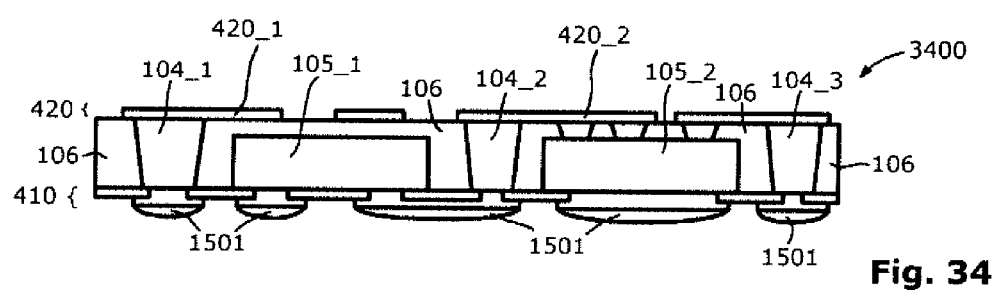

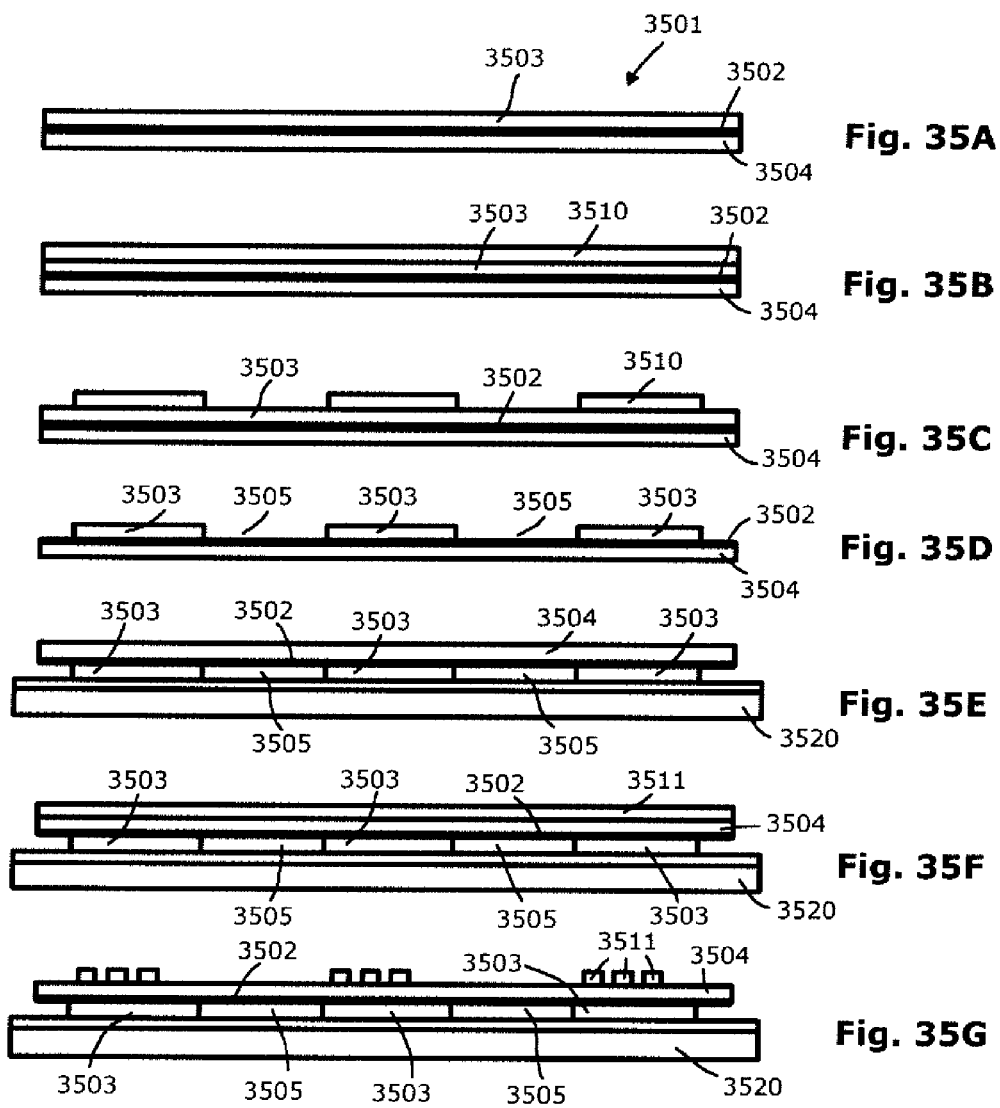

ELECTRONIC DEVICE PACKAGE INCLUDING METAL BLOCKS

TECHNICAL FIELD

This invention relates generally to the technique of electronic device packaging, and in particular to the technique of packaging multiple semiconductor chips.

BACKGROUND

Electronic device manufacturers are constantly striving to increase the performance of their products, while decreasing their cost of manufacture. A cost intensive area in the manufacture of electronic device packages is packaging the electronic component(s), e.g. semiconductor chip(s). Thus, electronic device packages and methods of manufacturing the same at low expenses and high yield are desirable. In particular, the performance of electronic device packages may be dependent from the heat dissipation capability and/or stability provided by the package. Packaging methods of power devices providing high thermal and/or mechanical robustness at low expenses and improved reliability are desirable.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 30 schematically illustrates a cross-sectional view of an embodiment of an electronic device package including an electromagnetic shielding.

FIG. 31 schematically illustrates a cross-sectional view of an embodiment of an electronic device package including a heat sink.

FIG. 32 schematically illustrates a cross-sectional view of a through hole matrix as may be included in any of the embodiments of electronic device packages disclosed herein.

FIG. 33 schematically illustrates a cross-sectional view of the through hole matrix of FIG. 32 when arranged between a first and a second redistribution structure.

FIG. 34 schematically illustrates a cross-sectional view of an embodiment of an electronic device package including a plurality of semiconductor chips wherein the semiconductor chips are oriented face-up and face-down, respectively.

DETAILED DESCRIPTION

Figure 1A:
FIGS. 1A-1D schematically illustrate cross-sectional views of an embodiment of a method of manufacturing an electronic device package.

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise. Further, as employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "directly on", e.g. in direct contact with, the implied surface. The word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer.

Devices containing one or more electronic components are described below. The electronic components may be semiconductor chips. Semiconductor chips may be of different type, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. The electronic components may also be passives such as, e.g., resistors, capacitors, or inductivities, or other electronic components such as, e.g., batteries, DCB (direct copper bonded) modules, ceramic base modules, etc.

In particular, one or more power semiconductor chips may be involved. Power semiconductor chips may, for example, be configured as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g. a PIN diode or a Schottky diode.

In particular, one or more semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure typically has electrodes on its two main surfaces, that is to say on its top side and bottom side. In particular, power semiconductor chips as, e.g., the transistors or diodes mentioned above may have a vertical structure.

In particular, one or more semiconductor chips having a horizontal structure may be involved. A semiconductor chip having a horizontal structure typically has chip electrodes only on one of its two main surfaces, e.g. on its active surface (at least if no through-semiconductor vias (TSV) are used). Logic integrated circuit chips as well as power semiconductor chips (e.g. power MISFET or power MOSFET or power HEMT) may have a horizontal structure.

In particular, one or more semiconductor chip configured as a sensor or actuator may be involved. A sensor or actuator semiconductor chip may include, e.g., an optical, electromagnetic, magnetic, or mechanical sensing or actuating device. A semiconductor sensor chip may, e.g., be configured as a light sensor, fingerprint sensor, ccd camera, magnetic field sensor, electro-magnetic field sensor, acceleration sensor, rotation sensor, microphone etc. Further, as mentioned above, other types of electronic component such as, e.g., passives, batteries, ceramic based modules etc. may be involved.

In particular, one or more semiconductor chip configured as a so-called MEMS (micro-electro mechanical systems) may be involved. A MEMS semiconductor chip may include micro-mechanical structures, such as, e.g., bridges, membranes or tongue structures. A MEMS semiconductor chip may be configured as a sensor or actuator, for example, pressure sensor, acceleration sensor, rotation sensor, microphone, etc.

The semiconductor chip(s) involved need not be manufactured from specific semiconductor material, for example, Si, SiC, SiGe, GaAs, and, furthermore, may contain inorganic and/or organic materials that are not semiconductors, such as, for example, insulators, plastics or metals.

The electronic devices described herein may include one or more logic integrated circuits (IC) to control one or more power semiconductor chips. The logic integrated circuit may include one or more driver circuits to drive one or more of the power semiconductor chips. The logic integrated circuit may, e.g., be a microcontroller including, e.g., memory circuits, level shifters, etc.

The electronic devices and methods of manufacturing electronic devices comprise structuring a metal layer to generate a structured metal layer having a plurality of openings. For example, the metal layer may comprise or be made of a material selected from the group consisting of Cu, Ni, Sn, NiSn, Au, Ag, Pt, Pd, Al, AlSiC, Mo and an alloy or multilayers or metal-and-ceramic structures of one or more of these metals, or graphite. The metal layer need not be homogenous or manufactured from just one material, that is to say various compositions and concentrations or multilayer structures of the materials contained in the metal layer are possible.

The metal layer may be structured to provide for metal blocks. The metal blocks may serve as electrical traces and/or through-connections for electrical redistribution purposes in the electronic device packages. The metal blocks may be embedded in the electronic device packages to improve or adapt mechanical properties such as, e.g., robustness (e.g. warpage resistance, stiffness), higher symmetry, processing, material availability, thermal expansion. That is, the metal blocks may form a reinforcement structure in the electronic device package. The structured metal blocks may also be embedded in the electronic device packages to improve thermal properties of the device packages such as, e.g., heat dissipation, thermal conductivity, heat capacity, etc.

The (e.g. continuous) metal layer may be structured to form openings and/or metal blocks with any desired geometric shape. The openings and/or the metal blocks may have a rectangular, polygonal, linear, round, or frame-like shape. In particular, a metal block may have a shape comprising or being composed of one or more L-shaped block segment. The metal blocks may be insular, i.e. separated from each other. One or a plurality of metal blocks may be embedded in one electronic device package. The metal blocks embedded in one electronic device package may be of different shape. In other words, the metal blocks embedded in one electronic device package may, e.g., be individual, i.e. may be at least partly of mutually different shape. A metal blocks may have substantially identical top and bottom shape. However, it is also possible that a metal block has a top shape that is different to its bottom shape. As will be explained in the following, this may be obtained by, e.g., half etching both from top and bottom side.

Various techniques for generating a structured metal layer (i.e. the openings and the metal blocks) may be used. Byway of example, the structured metal layer may be generated by etching. Depending on the metal material different etchants may be used, among them, e.g., copper chloride, iron chloride, HF, NaOH, $HNO_3$, $K_3Fe(CN)_6$, KI, sulfuric acid, phosphorous acid, etc. Etching may be accomplished by using a mask for masking the regions of the metal layer which are not to be etched (i.e. the metal blocks). The mask may be a structured organic mask layer applied on the metal layer. The structured organic mask layer may be applied by printing techniques, such as, e.g., stencil printing, screen printing, or ink jet printing. In other examples, a continuous layer of an organic material, e.g., a photoresist may be applied to the metal layer and subsequently structured, e.g., by photolithography (comprising, e.g., exposing, developing, etching) to produce the structured organic mask layer. For instance, spin coating may be used to apply the continuous layer of organic material. In other examples, the structured metal layer may be generated by material machining techniques such as, e.g., milling or stamping.

The semiconductor chips and the metal blocks of the structured metal layer may at least partly be surrounded or embedded in at least one encapsulating material forming an encapsulant. The encapsulating material may be an electrically insulating material and may comprise or be a thermoset material or a thermoplastic material. A thermoset material may, e.g., be made on the basis of an epoxy resin, a silicone resin, or an acrylic resin. A thermoplastic material may, e.g., comprise one or more materials selected from the group consisting of polyetherimide (PEI), polyether-sulfone (PES), polyphenylene-sulfide (PPS), polyamide-imide (PAI), and polyethylene-terephthalate (PET). Thermoplastic materials melt by application of pressure and heat during molding or lamination and (reversibly) harden upon cooling and pressure release. The encapsulating material may also be a plastic material such as, e.g., a high thermally resistant semi-rigid or rigid material such as polyimide, high Tg epoxy resin, cyanesther, or bismaleimide, more specifically bismaleimide-triazine BT laminate, glass reinforced epoxy resin, polxtetrafluororthylene (PTFE), carbon and/or Kevlar reinforced resins, polyester material, and so on.

The encapsulating material may comprise or be a polymer material. The encapsulating material may be filled or unfilled. In particular, the encapsulating material may comprise or be at least one of a filled or unfilled mold material, a filled or unfilled thermoplastic material, a filled or unfilled thermoset material, a filled or unfilled laminate, a fiber-reinforced laminate, a fiber-reinforced polymer laminate, or a fiber-reinforced polymer laminate with filler particles. Particles used for filling may comprise SiO, BN, AlN, SiN, diamond, carbon, metal, etc.

The encapsulating material may be applied over the one or more semiconductor chips and, e.g., the one or more metal blocks by, e.g., molding, laminating, or printing. In the first case, i.e. if the encapsulating material is a mold material, e.g., molding resin, various techniques such as, e.g., compression molding, injection molding, powder molding, liquid molding, transfer molding, or film-assisted molding (FAM) may be used to form an encapsulant or an encapsulation body. The mold material may be applied to overmold the semiconductor chips and the metal blocks. Chip electrodes of one or more semiconductor chips may, e.g., remain exposed and may serve as external terminals of the electronic device package (i.e. as package terminals).

In the second case, i.e. if the encapsulating material is made of a laminate material, the encapsulating material may have the shape of a layer, e.g. a piece of a sheet or foil that is laminated over the semiconductor chips and over the structured metal layer in the openings thereof the semiconductor chips are mounted. Heat and pressure may be applied for a time suitable to attach the piece of a sheet or foil to the underlying structure. During lamination, the electrically insulating foil or sheet is capable of flowing (i.e. is in a plastic state), resulting in that gaps between the semiconductor chips and, e.g., other topological structures such as, e.g., other electronic components inserted in the openings or the metal blocks defining the openings are filled with the polymer material of the electrically insulating foil or sheet. The electrically insulating foil or sheet may comprise or be any appropriate thermoplastic or thermoset material. In various embodiments, the insulating foil or sheet may comprise or be a prepreg (short for pre-impregnated fibers) made, e.g., of a combination of a fiber mat, for example glass or carbon fibers, and a resin, for example a thermoset or thermoplastic material. Prepreg materials are typically used to manufacture PCBs (printed circuit boards). The insulating foil or sheet may, e.g., further comprise molding resin films or resin films with or without particles. Again, also for laminate packages, chip electrodes of one or more semiconductor chip(s) may, e.g., remain exposed and may serve as external terminals of the electronic device package (i.e. as package terminals).

FIGS. 1A-1D illustrate cross-sectional views of an embodiment of a method of manufacturing an electronic device package disclosed herein further below. Referring to FIG. 1A, a metal layer 101 is provided. The metal layer 101 may be a metal foil being of one of the aforementioned metal materials or a composition thereof. The metal layer 101 may be applied, e.g., laminated, on a first temporary carrier 102. The lateral dimensions of the first temporary carrier 102 and/or the metal layer 101 may be equal to or greater than 2 cm, 5 cm, 10 cm, 20 cm, 30 cm, 40 cm, 50 cm in one or both lateral directions.

The metal layer 101 may have a constant thickness T. T may, e.g., be equal to or greater than or less than 5 µm, 10 µm, 20 µm, 50 µm, 100 µm, 150 µm, 200 µm, 300 µm, 400 µm, 500 µm, 600 µm, 700 µm, or 800 µm. As will be described further below, the metal layer 101 may be adhered to the first temporary carrier 102 by, e.g., an adhesive tape (not shown) or glue. Further, other types of temporary carriers may be used.

Figure 1B:
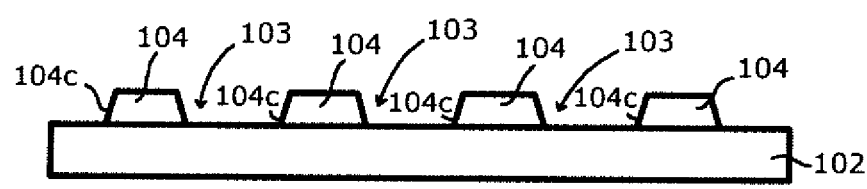

Referring to FIG. 1B, the metal layer 101 may be structured to generate a structured metal layer having a plurality of openings 103. On the other hand, metal blocks 104 may be formed by the structuring process. The metal blocks 104 may have an individual shape. Further, the metal blocks 104 may be completely separated from each other, i.e. may be insular. The thickness of the metal blocks 104 may be equal to or less than T. The spacings between the metal blocks 104, i.e. the lateral dimensions of the openings 103, may be different. Whilst some of the openings 103 may have lateral dimensions large enough to receive a semiconductor chip, other openings 103 between adjacent metal blocks 104 may merely serve to provide for electrical insulation between these metal blocks 104 and may thus be considerably smaller than the typical lateral chip dimensions. The spacings between adjacent metal blocks may thus be equal to or greater than or less than, e.g., 5 µm, 10 µm, 50 µm, 100 µm, 400 µm, 600 µm, 800 µm, 1 mm, or 2 mm.

As illustrated in FIG. 1B, the metal blocks 104 may optionally have a conical shape. Such conical shape may, e.g., be produced if the metal blocks 104 are structured by an etching process. In this case, the side walls 104c of the metal blocks 104 may taper in a direction facing away from the first temporary carrier 102. However, structuring of the metal layer 101 may be performed by other processes such as, e.g., mechanical processes which do not provide for tapered side walls 104c of the metal blocks 104. Further, it is also possible that the metal blocks 104 are applied to the first temporary carrier 102 as pre-structured elements or in a semi-pre-structured condition.

Figure 1C:
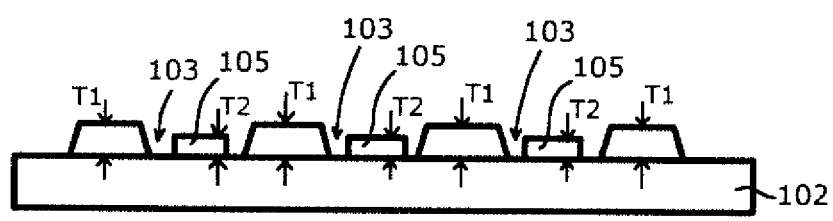

FIG. 1C illustrates a process of placing electronic components 105 into at least some of the openings 103. The electronic components 105 may be placed inside the openings 103 by, e.g., a pick-and-place process. The alignment may be done using aligning marks (not shown) that are generated on the metal layer 101 at, e.g., the same when the metal layer 101 is structured, see FIG. 1B. By way of example, the aligning marks may be etched to the metal layer 101 during the etching process to generate the openings 103. It is possible to use sequential processes or parallel processes (e.g. batch processes) to place the electronic components 105 into the openings 103.

As mentioned above, electronic components 105 may be of different type such as, e.g., semiconductor chips, passives, batteries, electronic modules, etc. In the following, without loss of generality, an electronic component 105 is exemplified by a semiconductor chip 105. However, throughout the entire description, all features and embodiments explained by way of example for a semiconductor chip 105 also apply to all other types of electronic components mentioned herein.

In one example the semiconductor chips 105 may be placed on the first temporary carrier 102 and may, e.g., be held in place by, e.g., the same adhesive tape (not shown) used to fix the metal layer 101 on the first temporary carrier 102. Other examples may transfer the structured metal layer comprising of the openings 103 and the metal blocks 104 to a carrier on which the semiconductor chips 105 are arranged in alignment to the openings 103. Other processes of bringing the semiconductor chips into the openings 103 are also possible.

As illustrated in FIG. 1C, the thickness T1 of the metal blocks 104 (e.g. T1=T) may be equal to or greater than the thickness T2 of the semiconductor chips 105. By way of example, the thickness T1 (and thus, e.g., the thickness of the metal layer 101) may be approximately equal to or greater than or less than 10 µm, 20 µm, 30 µm, 50 µm, 70 µm, 100 µm, 120 µm, 200 µm, 400 µm, 600 µm, 800 µm, or 1 mm thicker than the thickness T2 of the semiconductor chip 105.

Figure 1D:
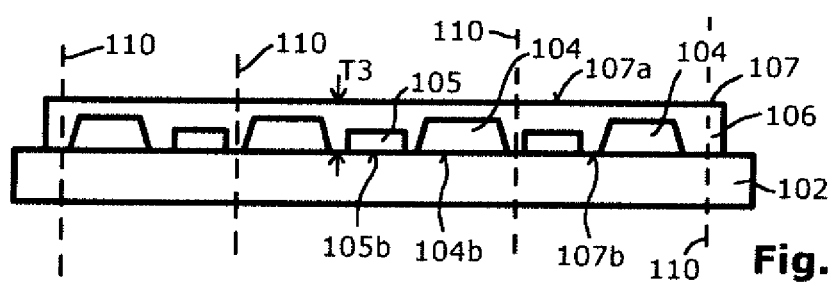

Referring to FIG. 1D, an encapsulating material 106 may be applied over the structured metal layer and the semiconductor chips 105 to form an encapsulation body 107. The encapsulation body 107 is also referred to as an "artificial wafer" or a "reconfigured wafer". Shapes and sizes of the encapsulation body 107 may vary. By way of example, encapsulation body 107 panel sizes of equal to or greater than 8", 12", 18" or, e.g., 550 mm×600 mm or even larger are possible.

The encapsulating material 106 may be one of the materials mentioned above. Further, the process to form the encapsulation body 107 may include one or more of the processes described above, e.g. molding, lamination, printing, etc. The encapsulating material 106 may be a material optimized for containing a structure composed of semiconductor chips (i.e. dies) 105 and metal blocks 104. By way of example, the CTE (coefficient of thermal expansion) of the encapsulating material 106 may be set either to be closer to the CTE of the metal material of the metal blocks 104 or may be set to be closer to the CTE of the semiconductor material of the semiconductor chips 105. By way of example, the metal material (e.g. copper) may have a CTE of about 18-20 ppm/K, and the semiconductor chips 105 may have a CTE of about 2-4 ppm/K. If the embedded arrangement composed of semiconductor chips 105 and metal blocks 104 is "metal block dominated", the CTE of the encapsulating material 106 may be selected to be closer to the CTE of the metal material than the CTE of the semiconductor material. On the other hand, if the arrangement composed of the metal blocks 104 and semiconductor chips 105 embedded by the encapsulating material 106 is "semiconductor material dominated", the CTE of the encapsulating material 106 may be selected to be closer to the CTE of the semiconductor material than the CTE of the metal material. "Metal block dominated" may mean that the percentage in volume of metal block material embedded in the encapsulation body 107 is greater than the percentage in volume of semiconductor die material embedded in the encapsulation body 107. On the other hand, "semiconductor material dominated" may mean that the percentage in volume of semiconductor die material embedded in the encapsulation body 107 is greater than the percentage in volume of metal block material embedded in the encapsulation body 107. By way of example, the CTE of the encapsulating material 106 may be equal to or less than or greater than −1 ppm, 0 ppm, 2 ppm, 4 ppm, 6 ppm, 8 ppm, 10 ppm, 12 ppm, 14 ppm, 16 ppm, 18 ppm, 20 ppm, 22 ppm, or 24 ppm. Further, multi-layer structures with different CTEs per layer (e.g. CTEs as disclosed above) are possible.

As mentioned above, the encapsulating material 106 may, e.g., be a laminate material or a mold material. After hardening or curing the encapsulating material 106 becomes cross-linked and rigid to provide stability to the embedded array of semiconductor chips 105 and metal blocks 104. The cross-linked encapsulating material 106 could also be soft, i.e. may have a low module such as, e.g., rubber.

As shown in FIG. 1D, the thickness T3 of the encapsulation body 107 may be equal to or greater than T1, i.e. the thickness of the metal blocks 104. The metal blocks 104 and the semiconductor chips 105 may be completely covered by the encapsulating material 106 at the top (second) main surface 107a of the encapsulation body. At the (bottom) first main surface 107b of the encapsulation body 107, the (bottom) first surfaces 105b of the semiconductor chips 105 and the (bottom) first surfaces 104b of the metal blocks 104 may be exposed. The first surfaces 105b of the semiconductor chips 105 may level with the first surfaces 104b of the metal blocks 104. That is, the first chip and metal block surfaces 105b, 104b may form part of the (bottom) first main surface 107b of the encapsulation body 107 and may, e.g., be in-plane.

Then, the encapsulation body 107 ("artificial wafer") may be separated into a plurality of electronic device packages. Separation lines are, by way of example, indicated in FIG. 1D and are denoted by reference numerals 110. Device packages singulated from the encapsulation body 107 may comprise one or more semiconductor chips 105 and one or more metal blocks 104.

FIGS. 1A-1D illustrate one exemplary embodiment of a method to manufacture electronic device packages including a semiconductor chip 105 and a metal block 104 by using, e.g., chip-in-substrate or chip embedding technologies, e.g. embedded wafer level packaging (eWLP) technology.

Additional process steps such as, e.g., thinning the encapsulation body 107, applying a first and/or a second electrical redistribution structure to the encapsulation body 107, etc. are possible and will be described by way of example further below.

Figure 2A:
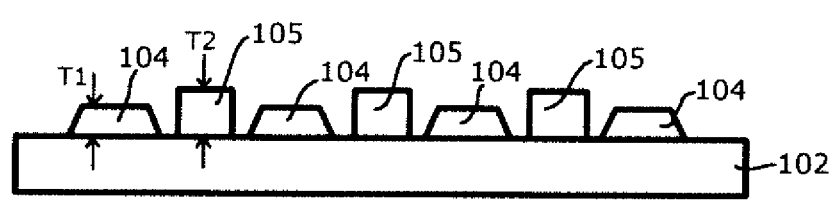
FIGS. 2A-2B schematically illustrate cross-sectional views of an embodiment of a method of manufacturing an electronic device package.
Figure 2B:
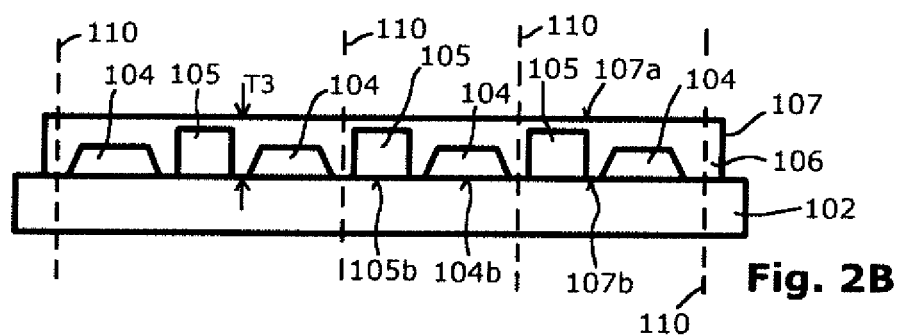

Referring to FIGS. 2A-2B, a modification of the process as illustrated in FIGS. 1A-1D is described. In this modified process the steps of FIG. 1A and FIG. 1B may be used the same way as described above. For the sake of brevity, these Figures are not shown again.

FIG. 2A compares to FIG. 1C. As a difference to FIG. 1C, the thickness T2 of the semiconductor chips 105 may be equal to or greater than the thickness T1 of the metal blocks 104.

FIG. 2B illustrates the application of the encapsulating material 106 on the arrangement composed of the array of metal blocks 104 and the array of semiconductor chips 105. The thickness T3 of the encapsulation body 107 may be equal to or greater than the thickness T2 of the semiconductor chips 105. Again, as described in conjunction with FIG. 1D, the encapsulating material 106 may completely cover the semiconductor chips 105 and the metal blocks 104 at the top main surface 107a of the encapsulation body 107, while leaving (bottom) first surfaces 105b and 104b of the semiconductor chips 105 and the metal blocks 104, respectively, exposed at the (bottom) first main surface 107b of the encapsulation body 107.

Separation of the encapsulation body 107 may be performed along separation lines 110. Separating the encapsulation body 107 to produce the electronic device packages may, e.g., be done by dicing, mechanical sawing, laser cutting, etching, in particular plasma etching, etc. It is to be noted that the separation lines 110 may, e.g., only intersect with encapsulating material 106, i.e. no semiconductor chips 105 and/or no metal blocks 104 are cut during the separation process. In this case, the side wall periphery of the semiconductor chip package produced by separating the encapsulation body 107 may completely be of encapsulating material 106 (at least if any optional electrical redistribution structures and, e.g., external terminals designed therein are disregarded).

FIGS. 3A-3F illustrate an exemplary process to produce electronic device packages, e.g., eWLP electronic device packages as will be described herein in more detail.

Figure 3A:
FIGS. 3A-3F schematically illustrate cross-sectional views of an embodiment of a method of manufacturing an electronic device package.
Figure 3B:
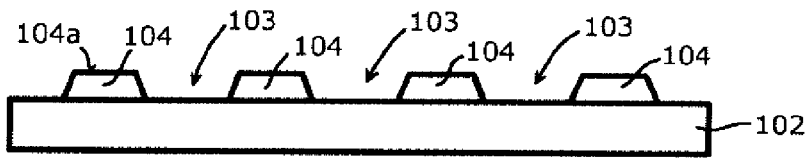

Referring to FIGS. 3A and 3B, a metal layer 101 may be structured to generate a structured metal layer having a plurality of openings 103 and metal blocks 104, compare FIGS. 1A and 1B.

Figure 3C:
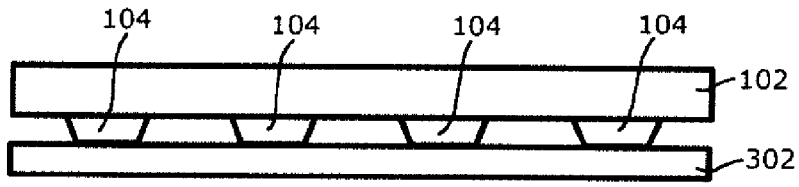

In FIG. 3C, the structured metal layer 103, 104, adhered to the first temporary carrier 102, is transferred to a second temporary carrier 302. The metal blocks 104 are placed with their (top) surfaces facing the second temporary carrier 302 onto the second temporary carrier 302.

Figure 3D:
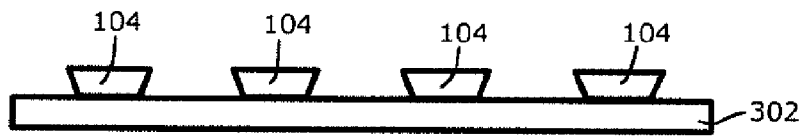

Then, as illustrated in FIG. 3D, the first temporary carrier 102 is released from the metal blocks 104 (i.e. from the structured metal layer 101).

Figure 3E:
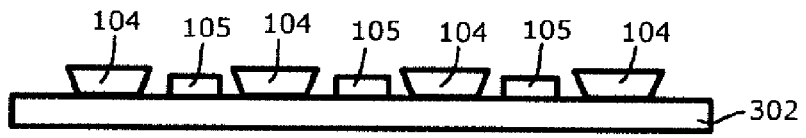

Referring to FIG. 3E, the semiconductor chips 105 are placed on the second temporary carrier 302 into at least some of the openings 103 between metal blocks 104. It is also possible that the semiconductor chips 105 are placed onto the second temporary carrier 302 before the structured metal layer (metal blocks 104 and openings 103) was transferred to the second temporary carrier 302. In this case, the semiconductor chips 105 are already placed on the second temporary carrier 302 in FIG. 3C.

Figure 3F:
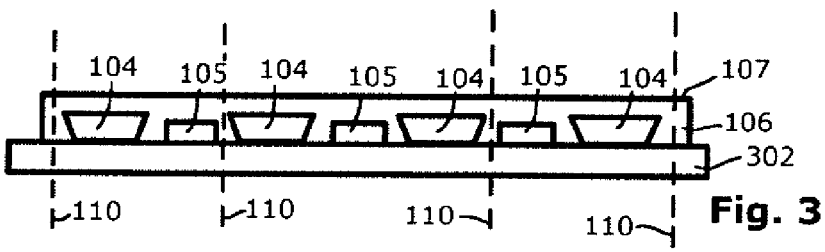

In FIG. 3F the encapsulating material 106 is applied over the structured metal layer 103, 104 and the semiconductor chips 105 to form the encapsulation body 107. In order to avoid reiteration, reference is made to the description above.

Again, as explained in conjunction with FIGS. 1A-1D and FIGS. 2A-2B, the thickness T2 of the semiconductor chips 105 may either be equal to or greater than or less than the thickness T1 of the metal blocks 104. Further, the thickness T3 of the encapsulation body 107 may, e.g., be equal to or greater than T1 and/or T2.

In general, the processes illustrated in FIGS. 3A-3F may be similar to the processes illustrated in the previous figures except that two temporary carriers 102, 302 may be used. The usage of the first temporary carrier 102 for metal layer structuring and the second temporary carrier 302 for semiconductor chip 105 placement provides the possibility that the semiconductor chips 105 need not to be placed on the first temporary carrier 102. As the first temporary carrier 102 may be affected or damaged by the metal layer structuring process, the multiple temporary carrier concept of FIGS. 3A-3F may improve or facilitate the overall manufacturing process. Further, the processes illustrated in FIGS. 3A-3F provide the opportunity to flip the metal blocks 104 when placing them onto the second temporary carrier 302. As the metal blocks 104 may have a tapered shape, the flip block orientation of the metal blocks 104 (see FIG. 3D) may provide for openings 103 which narrow in a direction facing away from the second temporary carrier 302.

It is to be noted that in all embodiments described herein, the semiconductor chips 105 may be placed face-up or face-down (i.e. in a flip-chip orientation) onto the temporary carrier on which the encapsulation body ("artificial wafer") is produced (i.e. on the first or second temporary carrier 102, 302). It is also possible that some of the semiconductor chips 105 are placed in a face-up orientation while other semiconductor chips 105 are placed in a face-down orientation on the temporary carrier on which the encapsulation body is produced. That way, multi-component, e.g. multi-chip electronic device packages may be produced in which at least one semiconductor chip 105 is arranged in a face-up orientation and at least one other semiconductor chip 105 is arranged in a face-down orientation within the package. In horizontal semiconductor chips, face-up typically means that the active surface is face-up. In vertical semiconductor chips, typically the drain or collector electrode is at the down side and the control and source or emitter electrodes are arranged at the upper side of the semiconductor chip.

FIGS. 4A-4H illustrate, byway of example, an exemplary method of producing electronic device packages in accordance with the above description, in particular the description relating to FIGS. 1A-1D and FIGS. 2A-2B (i.e. the one temporary carrier embodiment). All features described above are applicable to the processes of FIGS. 4A-4H. Vice versa, all features described in the following are applicable to the processes of FIGS. 1A-1D and FIGS. 2A-2B.

Figure 4A:
FIGS. 4A-4H schematically illustrate cross-sectional views of an embodiment of a method of manufacturing an electronic device package.

In FIG. 4A, the metal layer 101 is, e.g., laminated onto the first temporary carrier 102 with, e.g., a thermal release tape 401. The thermal release tape 401 may have a relatively low release temperature of, e.g., 90° C. Also different release methods are possible, e.g., UV assisted release, etc. Further, a temporary glass carrier, zero bond, sticky adhesion layer could be utilized.

Figure 4B:
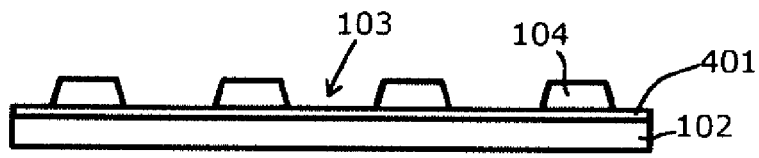

In FIG. 4B the metal layer 101 is structured into the metal blocks 104. By way of example, a photoresist (not shown) may be laminated or coated on top of the upper surface of the metal layer 101. Then, the required structure may be formed by exposing, developing and etching. As mentioned above, the metal structure generated that way may be highly variable in design and may contain individual metal block patterns for individual electronic device packages.

Figure 4C:
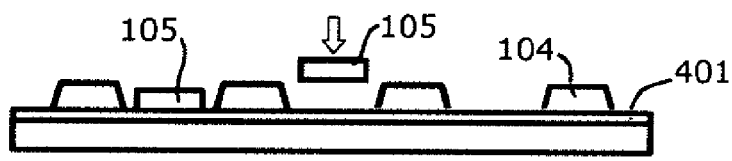

In FIG. 4C the semiconductor chips 105 are placed inside the openings 103 or cavities in the structured metal layer and may be attached to the thermal release tape 401.

Figure 4D:
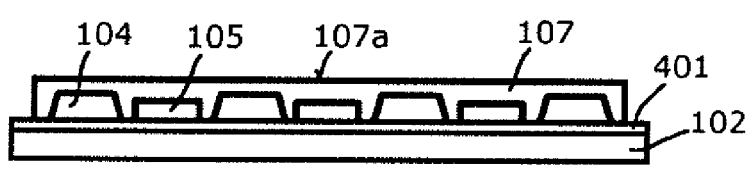

In FIG. 4D the artificial wafer (encapsulation body 107) is produced, e.g., by using a compression molding process or any other process mentioned herein.

Figure 4E:
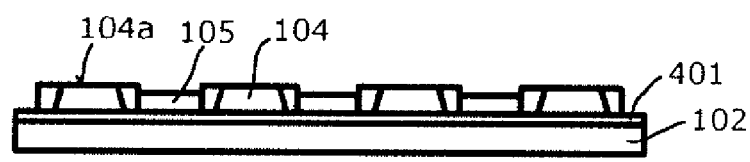

In FIG. 4E the encapsulation body 107 may be thinned at it top main surface 107a. Thinning may be performed by using a mechanical grinding process. By thinning the metal blocks 104 may be exposed at their top surface (this surface may correspond to the upper side of the electronic device package to be produced). The metal block thickness T1 may, e.g., be approximately 20 µm, 30 µm, 40 µm, 50 µm, 60 µm, 70 µm, 80 µm, or 100 µm greater than the thickness T2 of the semiconductor chips 105, and thinning may be done approximately half this difference (e.g. equal to or greater than or less than 10 µm, 20 µm, 30 µm, 40 µm, or 50 µm) distance between the semiconductor chip 105 surface and the metal block 104 surface).

Further to FIG. 4E, the residual encapsulating material 106 covering the semiconductor chips 105 at the top main surface 107a of the encapsulating body 107 may be opened, e.g., by using laser drilling processes. That way, electrical through-connections (vias) may be formed. The formation of electrical through-connections may also be performed at a later processing step. Further, opening of the encapsulation body 107 at the top main surface 107a thereof to access and/or partly or completely expose the semiconductor chips 105 is an optional process.

Figure 4F:
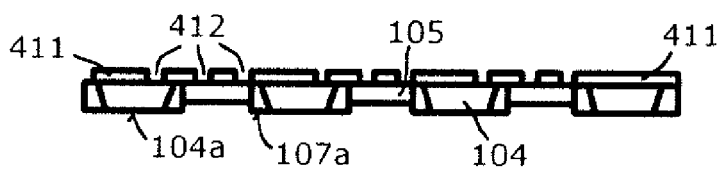
Figure 4G:
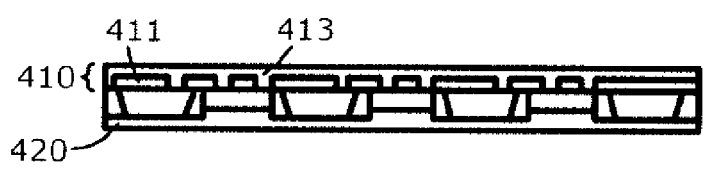
Figure 4H:
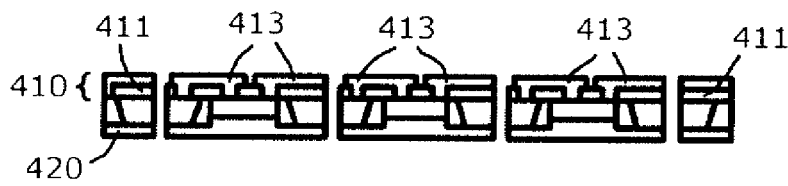

Referring to FIGS. 4F-4H, a first electrical redistribution structure 410 may then be formed on the surface of the encapsulation body 107 removed from the first temporary carrier 102. To that end, the encapsulation body 107 may optionally be flipped (see FIG. 4F). The first (bottom in FIG. 4E, top in FIG. 4F) surface 107b of the encapsulation body 107 may then be coated, e.g. with a polymer layer 411, e.g. a photo-definable polyimide layer. The polymer layer 411, or, more generally, insulating layer 411, may be structured to form openings 412 to the encapsulation body 107. More specifically, some of the openings 412 may be formed to connect to the metal blocks 104 and some of the openings 412 may be formed to connect to electrodes of the semiconductor chips 105.

Referring to FIG. 4G, a metal redistribution layer 413 may be applied over the structured polymer layer 411. By way of example, the metal redistribution layer 413 may be formed by plating, e.g., galvanic plating or electroless plating. The metal redistribution layer 413 may electrically connect to the metal blocks 104 and/or to the semiconductor chips 105 through the openings 412 of the polymer layer 411.

The metal redistribution layer 413 may then be structured to provide for the first electrical redistribution structure 410 as illustrated by way of example in FIG. 4H. This first electrical redistribution structure 410 may form the mounting surface of the electronic device package. The metal redistribution layer 413 may provide for or connect to the external terminals of the electronic device package to be produced. To that end, as will be described later on, e.g. solder deposits may be attached to the first electrical redistribution structure 410. Such solder deposits (not shown in FIG. 4G or FIG. 4H) may be attached to the metal redistribution layer 413 or, if a multi-layer first electrical redistribution structure 410 is provided, to the outermost metal redistribution layer of this multi-layer first electrical redistribution structure 410.

It is to be noted that the generation of the first electrical redistribution structure 410 (including, e.g., polymer layer 411 generation, generation of openings 412, application of metal redistribution layer 413, structuring of metal redistribution layer 413) and the (optional) attachment of solder deposits to the first electrical redistribution structure 410 (e.g. to the structured metal redistribution layer 413) may, e.g., be performed on wafer level, i.e. before separating the encapsulation body 107 into the plurality of electronic device packages as illustrated in FIG. 4H.

Returning to FIG. 4G, a metallization structure or second electrical redistribution structure 420 may optionally be applied to the second main surface 107a of the encapsulation body 107. As mentioned above, openings may have been formed over the semiconductor chips 105 (see FIG. 4F). The second electrical redistribution structure 420 may be generated, e.g., by electroless or galvanic plating, printing, etc.

By way of example, if a galvanic plating process is used, a seed layer (not shown) may be deposited onto the second main surface 107a of the encapsulation body 107, i.e. onto the exposed metal block surfaces and into the openings to the semiconductor chips 105 (FIG. 4F). The seed layer may, e.g., be applied by sputtering techniques. The seed layer may then be employed as an electrode, and copper or other metals or metal alloys may be plated onto the seed layer to the desired height. Alternatively, electroless plating or other techniques allowing to produce a structured or unstructured interconnect may be used to generate the second electrical redistribution structure 420.

As shown in FIG. 4H, electronic device package separation may be performed at the end of the processes described above or at an earlier stage, e.g. before application of the second electrical redistribution structure 420, if any.

It is to be noted that the second electrical redistribution structure 420 may be plated onto the second main surface 107a to have virtually any desired height. Therefore, the second electrical redistribution structure 420 may be suitable to provide for high thermal conductivity and high thermal capacity. The second electrical redistribution structure 420 may also provide for an electrical contact to be made to the semiconductor chips 105, in particular if one or more of the semiconductor chips 105 is a power semiconductor chip 105. By way of example, the second electrical redistribution structure 420 may electrically connect to a semiconductor chip load electrode such as, e.g., a drain electrode or a source electrode of a (e.g. vertical) semiconductor power transistor.

FIGS. 5A-5I illustrate an exemplary manufacturing process similar to the process as described in conjunction with FIGS. 4A-4H. However, the manufacturing process of FIGS. 5A-5I is based on the two temporary carrier concept of the process of FIGS. 3A-3I. In order to avoid reiteration, reference is made to all embodiments described above, and features thereof may be combined with the features described in the following in conjunction with FIGS. 5A-5I.

Figure 5A:
FIGS. 5A-5I schematically illustrate cross-sectional views of an embodiment of a method of manufacturing an electronic device package.
Figure 5B:

Briefly, the processes illustrated in FIGS. 5A and 5B are similar to the processes illustrated in FIGS. 4A and 4B.

Figure 5C:
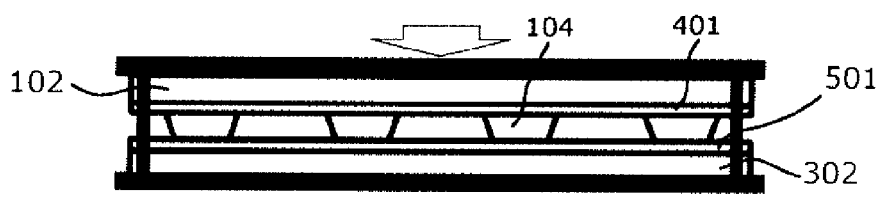

In FIG. 5C the structured metal layer 103, 104 is transferred to the second temporary carrier 302. The second temporary carrier 302 may be provided with a second thermal release tape 501. The second thermal release tape 501 may have a higher release temperature (e.g. about 150° C.) than the first thermal release tape 401 (e.g. about 90° C.). That way, by applying a suitable temperature, the structured metal layer 103, 104 may be handed over from the first temporary carrier 102 to the second temporary carrier 302. Without saying, release methods other than thermal release are feasible, e.g. radiation-initiated release (e.g. UV release), etc.

Figure 5D:
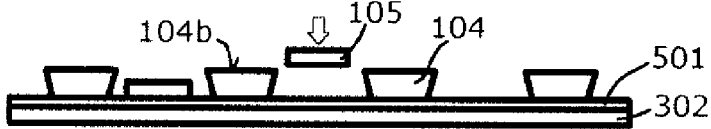

In FIG. 5D the semiconductor chips 105 are placed onto the second temporary carrier 302 and are adhered thereto by, e.g., the second thermal release tape 501. Alignment may be done by, e.g., using aligning marks (not shown) that are etched to the metal layer 101 during, e.g., the metal layer 101 structuring process (FIG. 5B). It is to be noted that the aligning marks may be etched the whole distance through the metal layer 101 in order to be visible at the face-up bottom surface 104b of the metal blocks 104.

FIGS. 5E-5I illustrate processes which are similar to the processes described above to FIGS. 4D-4H, and reference is made to this description in order to avoid reiteration. As a difference to the processes described to FIGS. 4D-4H, the process of removing the encapsulation body 107 from the second temporary carrier 302 may need to be performed at a higher temperature and the orientation of the cone-shaped metal blocks 104 in the finished electronic device packages may be opposite the orientation of the cone-shaped metal blocks 104 of the finished electronic device packages as shown in FIG. 4H.

Figure 6:
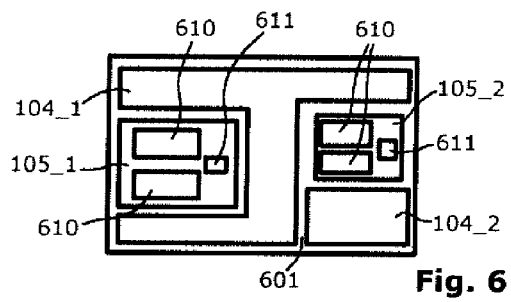
FIG. 6 schematically illustrates a bottom view of an exemplary device package section of FIG. 4C or FIG. 5D.

FIG. 6 is a bottom view of a semiconductor chip package at a stage of the fabrication process corresponding to FIG. 4C or FIG. 5D, respectively, i.e. after metal layer structuring and semiconductor chip placement and before applying the encapsulating material 106. More specifically, the view of FIG. 6 is, e.g., the footprint of one semiconductor chip package as seen by the low release temperature adhesive tape 401 (FIG. 4C) or by the high release temperature adhesive tape 501 (see FIG. 5D). Two metal blocks 104_1 and 104_2 and two semiconductor chips 105_1 and 105_2 are, by way example, comprised within the semiconductor chip package.

By way of example, the metal block 104_1 may enclose the opening in which the semiconductor chip 105_1 is placed at, e.g., three of the four sides. The opening in which the semiconductor chip 105_2 is placed may be bordered both by, e.g., two side faces of the metal block 104_1 and a side face of the metal block 104_2. The metal block 104_1 and the metal block 104_2 are disconnected from each other. In general, one, two, three or even all four sides of a semiconductor chip 105 may be neighbored by corresponding side faces of one metal block 104 or of multiple metal blocks 104_1, 104_2. In a region, where the metal block 104_1 and the metal block 104_2 are neighboring each other, the metal blocks 104_1, 104_2 may be spaced apart by a small gap 601 of a gap width equal to or less than, e.g., 100 μm, 50 μm, 30 μm, 10 μm, 5 μm, etc.

The semiconductor chips 105_1 and 105_2 may be surrounded by at least one, two or three sides (see FIG. 6) by the metal blocks 104_1, 104_2. The metal blocks 104_1, 104_2 may, e.g., have a rectangular shape or a shape composed of one or more L-shaped segments. The semiconductor chips 105_1, 105_2 may have chip electrodes 610, 611 arranged at the bottom face 105b of the semiconductor chips 105_1, 105_2. By way of example, chip electrodes 610 may be load electrodes, whereas chip electrode 611 may be a control electrode such as, e.g., a gate electrode. In embodiments in which the bottom surface 105b of the semiconductor chips 105_1, 105_2 merely contains one load electrode (e.g. the source electrode), the other load electrode (e.g. the drain electrode) may be arranged on the top surface 105a of the semiconductor chips 105_1, 105_2. Further, as stated previously, the semiconductor chips 105_1, 105_2 may be of different type (e.g. power semiconductor chip, logic semiconductor chip, MEMS semiconductor chip, sensor chip, etc.), and further, other types of electronic components 105 may be used.

Figure 5E:
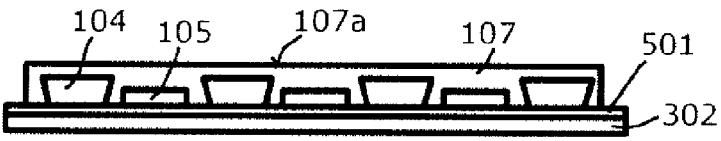
Figure 5F:
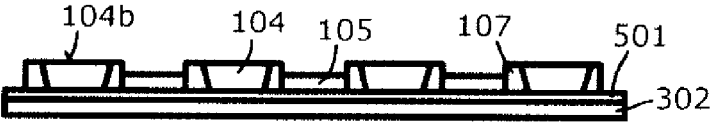
Figure 7:
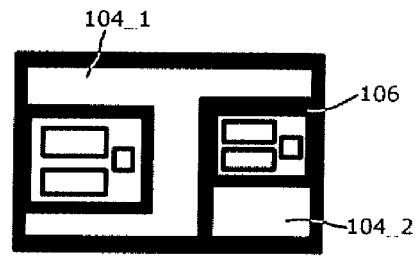
FIG. 7 schematically illustrates a bottom view of an exemplary device package chip section of FIG. 4D or FIG. 5E.

FIG. 7 illustrates a bottom view of an electronic device package of FIG. 6 during a stage of the fabrication process corresponding to, e.g., FIG. 4D or 5E. The gaps or spacings between the metal blocks 104_1, 104_2 and the semiconductor chips 105_1, 105_2 are filled with encapsulating material 106. As apparent in FIG. 7, the overall package material may be dominated by metal rather than by encapsulating material 106. The structured metal layer (i.e. the metal blocks 104_1, 104_2) may improve the thermal performance of the electronic device package and may be used to bring signals or load currents from the package bottom side to the package top side.

Figure 5G:
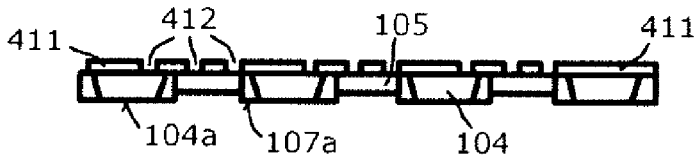
Figure 5H:
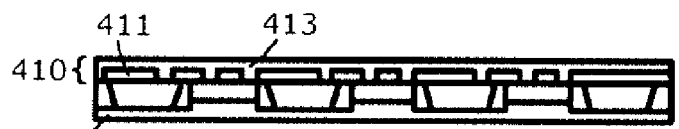
Figure 8:
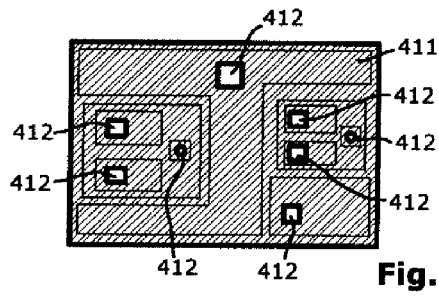
FIG. 8 schematically illustrates a top view of an exemplary device package section of FIG. 4F or FIG. 5G.

FIG. 8 illustrates an exemplary bottom view of the electronic device package of FIGS. 6-7 during a fabrication stage corresponding to FIG. 4F or 5G. As described above, a polymer layer 411 of a first electrical redistribution structure 410 has been applied and openings 412 have been produced in the polymer layer 411. Openings 412 may connect to the metal block 104_1, 104_2 and to the electrodes 610, 611 of the semiconductor chips 105_1, 105_2.

Figure 5I:
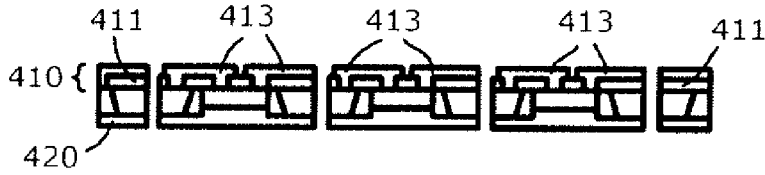
Figure 9:
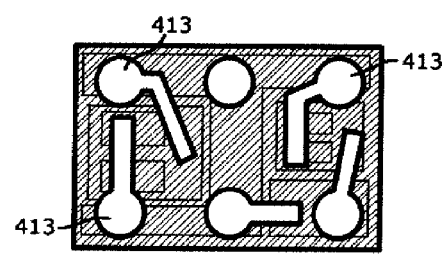
FIG. 9 schematically illustrates a top view of an exemplary device package of FIG. 4H or FIG. 5I.

FIG. 9 illustrates an exemplary bottom view of a semiconductor chip package during a stage of the fabrication process corresponding to FIG. 4H or 5I. Rerouting is performed by the structured metal redistribution layer 413. Structuring of the metal redistribution layer 413 may comprise sputtering and galvanic (i.e. electrochemical) plating processes, or, e.g., electroless metal plating processes or printing processes. Optionally, other insulation layers and/or structured metal redistribution layers may be added. The first structured metal redistribution layer 413 may comprise structures which interconnect chip electrodes 610, 611 to metal blocks 104_1, 104_2 or may comprise structures which interconnect chip electrodes 610, 611 to each other or may comprise structures which do not interconnect a plurality of openings 412 but merely provide for a bump pad on which a solder deposit is to be placed.

Figure 10:
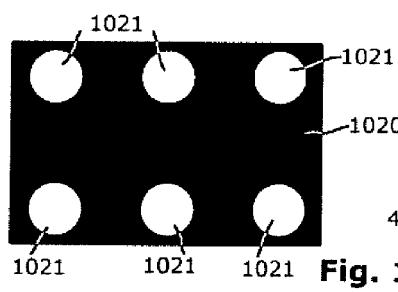
FIG. 10 schematically illustrates a top view of an exemplary electronic device package of FIG. 4H or FIG. 5I equipped with a solder stop mask.

FIG. 10 illustrates, byway of example, the application of an additional polymer layer (not shown in FIGS. 4 and 5) 1020, which is applied over the structured metal redistribution layer 413. The polymer layer 1020 may serve as an (optional) solder stop mask. To that end, the polymer layer 1020 may comprise openings 1021 which expose solder bump pads of the structured metal redistribution layer 413. The polymer layer 1020 may form a part of the first electrical redistribution structure 410.

Figure 11:
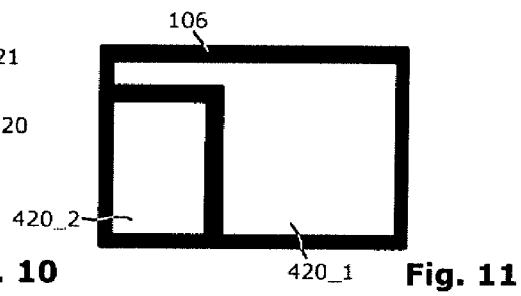
FIG. 11 schematically illustrates a bottom view of an exemplary electronic device package of FIG. 4H or FIG. 5I.

FIG. 11 illustrates a top view of the electronic device package illustrated in FIGS. 6-10 during its fabrication process. FIG. 11 may correspond to a stage of fabrication of the electronic device package corresponding to FIG. 4A or 5I, i.e. after the generation of a second electrical redistribution structure 420 and after separating the encapsulation body 107 into the plurality of electronic device packages. As apparent in FIG. 11, the entire periphery of the electronic device package may be formed by encapsulating material 106 of the encapsulation body 107. Further, the top surface 105a of the semiconductor chips 105_1, 105_2 may be covered partly or completely by the metal material of the second electrical redistribution structure 420. The second electrical redistribution structure 420 may but does not have to be connected to a semiconductor chip electrode optionally arranged on the top surface 105a of the semiconductor chips 105_1, 105_2. Further, it is possible that the second electrical redistribution structure 420 may be separated in mutually disconnected parts 420_1 and 420_2, wherein each part 420_1, 402_2 may be electrically connected to a corresponding metal block 104_1, 104_2, respectively, or that the second electrical redistribution structure 420 is a structured or continuous layer configured to electrically interconnect different metal blocks 104_1, 104_2.

Figure 12:
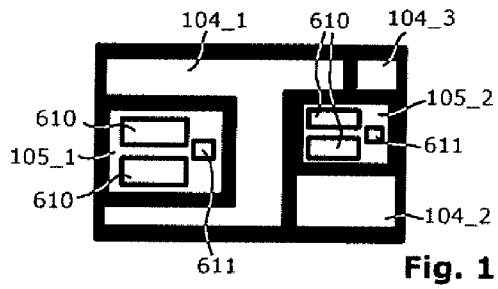
FIG. 12 schematically illustrates a bottom view of an exemplary electronic device package section of FIG. 4D or FIG. 5E as a variant to FIG. 7.

FIG. 12 is an exemplary view of an electronic device package similar to the view shown in FIG. 6. In FIG. 12 three metal blocks 104_, 104_2, and 104_3 are provided within the electronic device package. Except of this, the electronic device package of FIG. 12 may be identical to the semiconductor package of FIG. 6, and reference is made to the above description in order to avoid reiteration.

Figure 13:
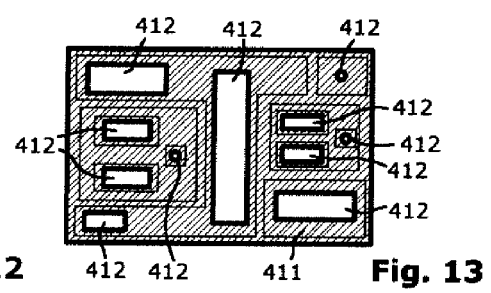
FIG. 13 schematically illustrates a top view of an exemplary electronic device package section of FIG. 4F or FIG. 5G as a variant to FIG. 8.

FIG. 13 is a view of the electronic device package shown in FIG. 12. The view of FIG. 13 is similar to the view of FIG. 8, and reference is made to the above description to avoid reiteration. It is to be noted that the third metal block 104_3 may provide for an additional external terminal of the electronic device package. Further, as illustrated in FIG. 13, the openings 412 of the polymer layer 411 of the first electrical redistribution structure 410 may be substantially larger than the openings 412 shown in FIG. 8. That way, heat dissipation of the electronic device package to an external application, e.g., a customer's application board, may be substantially improved.

Figure 14:
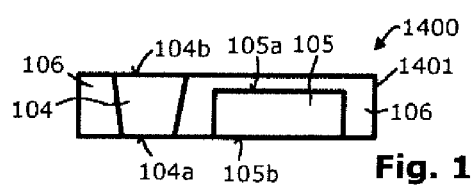
FIG. 14 schematically illustrates a cross-sectional view of an embodiment of an electronic device package.

Referring to FIG. 14, an exemplary electronic device package 1400 is shown. The electronic device package comprises at least one metal block 104 having a first surface 104a and a second surface 104b opposite the first surface 104a. Further, the electronic device package 1400 comprises at least one semiconductor chip 105 arranged laterally adjacent to the at least one metal block 104, wherein a spacing between the metal block 104 and the semiconductor chip 105 may be filled with encapsulating material 106. The semiconductor chip 105 may have a first (bottom) surface 105b and a second (top) surface 105a opposite the first surface 105b. An encapsulant 1401 comprising or being made of the encapsulating material 106 embeds the at least one metal block 104 and the at least one semiconductor chip 105.

The first surface 105b of the at least one semiconductor chip 105 may level with the bottom surface 104a of the at least one metal block 104. The encapsulating material 106 may completely cover the second surface 105a of the semiconductor chip 105. The top surface 104b of the metal block 104 may be exposed by the encapsulating material 106. That is, the metal block 104 may form a via extending through the encapsulating material 106.

Figure 15:
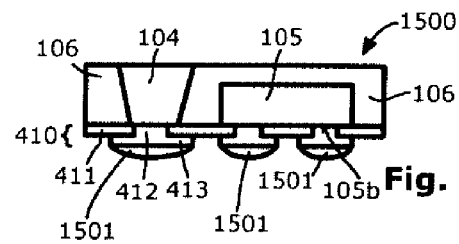
FIG. 15 schematically illustrates a cross-sectional view of an embodiment of an electronic device package including a first electrical redistribution structure.

Referring to FIG. 15, an exemplary electronic device package 1500 is shown. A first electrical redistribution structure 410 may be provided over the first surface 105b of the at least one semiconductor chip 105 and over the bottom surface 104a of the at least one metal block 104. The first electrical redistribution structure 410 may be electrically connected to the at least one metal block 104 and an electrode (not shown) arranged on the first surface 105b of the at least one semiconductor chip 105. As described above, the first electrical redistribution structure 410 may comprise a polymer layer 411 having openings 412, a structured metal redistribution layer 413 and solder deposits 1501. Optionally, a solder mask layer (not illustrated) may be provided to define the location of the solder deposits 1501 on the structured metal redistribution layer 413.

Figure 16:
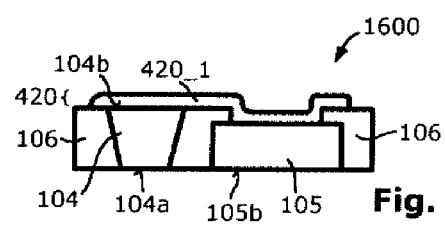
FIG. 16 schematically illustrates a cross-sectional view of an embodiment of an electronic device package including a second electrical redistribution structure.

Referring to FIG. 16, an exemplary electronic device package 1600 is illustrated. The electronic device package 1600 comprises a second electrical redistribution structure 420 arranged over the second (top) surface 105a of the at least one semiconductor chip 105 and over the top surface 104b of the at least one metal block 104. The second electrical redistribution structure 420 may comprise at least one structured metal redistribution layer 420_1. The structured metal redistribution layer 420_1 may be electrically connected to the at least one metal block 104 and, optionally, to the at least one semiconductor chip 105.

Figure 17:
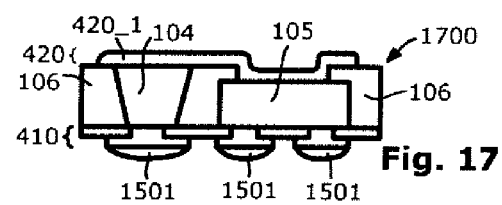
FIG. 17 schematically illustrates a cross-sectional view of an embodiment of an electronic device package including a first and a second electrical redistribution structure.

FIG. 17 illustrates an exemplary electronic device package 1700. The electronic device package 1700 may contain both a first electrical redistribution structure 410 and a second electrical redistribution structure 420 as described herein. The metal block 104 may form a via penetrating the encapsulating material 106 and the second electrical redistribution structure 420 may form a backside connection between the semiconductor chip 105 and the metal block 104.

All exemplary electronic device packages 1400, 1500, 1600, 1700 may be provided with cone-shaped metal blocks 104 tapering to the bottom of the electronic device package or with metal blocks 104 tapering to the top of the electronic device packages 1400, 1500, 1600, 1700 (not shown). Further, all electronic device packages 1400, 1500, 1600, 1700 may comprise a semiconductor chip 105 of horizontal or vertical design and may comprise a semiconductor chip 105 having a thickness T2 smaller, equal to or greater than the thickness T1 of the metal block 104. Further, it is to be noted that the surface 104b of the metal block 104 must be exposed at package periphery but may also be partly or completely covered by the encapsulating material 106.

Figure 18:
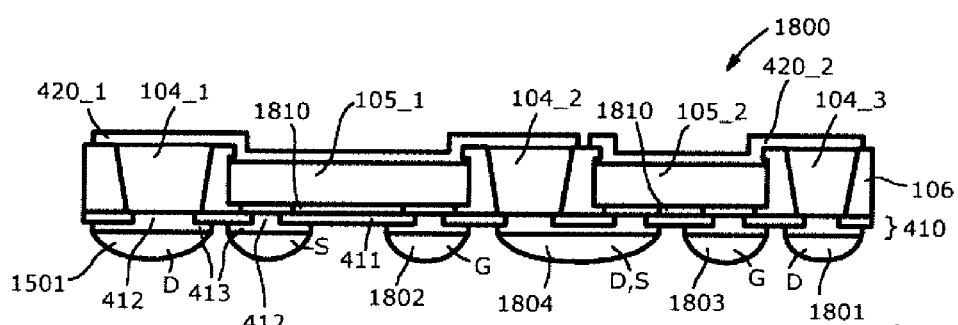
FIG. 18 schematically illustrates a cross-sectional view of an embodiment of an electronic device package including a plurality of semiconductor chips and a first and a second electrical redistribution structure.

FIG. 18 illustrates an exemplary multi-chip electronic device package 1800. The electronic device package 1800 comprises an (optional) first electrical redistribution structure 410 and/or an (optional) second redistribution structure 420 as described herein.

By way of example, the electronic device package 1800 may comprise a half-bridge circuitry. A half-bridge circuitry, may, e.g., be implemented as a circuit for converting DC or AC voltages into DC voltages, so-called DC-DC converters and AC-DC converters, respectively. By way of example, voltages applied to a DC-DC converter may be in a range between, e.g., 30-150 V. Voltages applied to an AC-DC converter may, e.g., be in a range between 300-1000 V.

In FIG. 18 the first semiconductor chip 105_1 may form a low side power switch and the second semiconductor chip 105_2 may form a high side power switch of the half-bridge circuit. More specifically, the first and second semiconductor chips 105_1, 105_2 may, e.g., be N-MOSFETs. As illustrated in FIG. 18, the drain of the first semiconductor chip 105_1 may be connected via metal block 104_1 to solder deposit 1501. Further, the drain of the first semiconductor chip 105_1 may be connected via metal block 104_2 to the source electrode of the second semiconductor chip 105_2. The drain electrode of the second semiconductor chip 105_2 may, e.g., be connected via the third metal block 104_3 to a solder deposit 1801 forming the high side drain terminal 1801 of the electronic device package 1800. Terminals 1802 and 1803 form the low side and high side gate terminals, respectively, of the electronic device package 1800. Terminal 1804 may, e.g., form the low side drain and high side source node of the electronic device package 1800.

As illustrated by way of example in FIG. 18, the encapsulating material 106 may, e.g., provide for a first insulating layer 1810 of the first electrical redistribution structure 410. The first insulating layer 1810, formed by the encapsulating material 106 on the bottom face 105b of the semiconductor chips 105_1, 105_2, may be produced during the encapsulating process. By way of example, the first insulating layer 1810 may be generated by liquid encapsulating material 106 flowing beneath the semiconductor chips 105_1, 105_2 during the encapsulation process. To that end, the chip electrodes at the bottom surface 105b of the semiconductor chips 105_1, 105_2 may project a small distance over the semiconductor material surface in order to provide for a gap between the (first or second) temporary carrier 102, 302 and the semiconductor portion of the bottom face 105b of the semiconductor chips 105_1, 105_2.

The provision of a first insulating layer 1810 forming part of the first electrical redistribution structure 410 may be applied to all embodiments of electronic device packages described herein.

Figure 19:
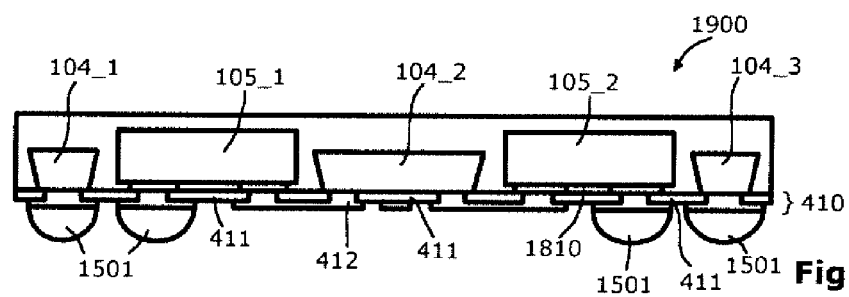
FIG. 19 schematically illustrates a cross-sectional view of an embodiment of an electronic device package including a plurality of semiconductor chips and a first electrical redistribution structure.

FIG. 19 illustrates an exemplary electronic device package 1900. The electronic device package 1900 may be similar to electronic device package 1800 except that the semiconductor chips 105_1 and 105_2 may have a thickness T2 greater than the thickness T1 of the metal blocks 104_1, 104_2, 104_3. Further, the electronic device package 1900 may have a top surface which is completely formed by encapsulating material 106. That is, e.g., no second redistribution structure 420 may be applied to the top surface of the electronic device package 1900. In this case, the metal blocks 104_1, 104_2, 104_3 may not be designed to route signals or load currents from one side of the package to the other side of the package. However, the metal blocks 104_1, 104_2, 104_3 may contribute to the first electrical redistribution structure 410 and may provide for increased stability, robustness, thermal properties, etc. of the electronic device package 1900.

Figure 20:
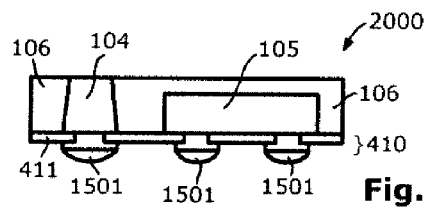
FIG. 20 schematically illustrates a cross-sectional view of an embodiment of an electronic device package including a first electrical redistribution structure.

Referring to FIG. 20, an exemplary electronic device package 2000 is shown. The electronic device package 2000 is similar to the electronic device package 1500, and reference is made to the description thereof to avoid reiteration. The metal block 104 may form a via extending through the encapsulating material 106. As a difference to electronic device package 1500, the metal block 104 tapers in the direction from the first electrical redistribution structure 410 to the upper (backside) surface of the electronic device package 2000.

Figure 21:
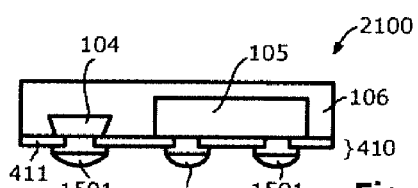
FIG. 21 schematically illustrates a cross-sectional view of an embodiment of an electronic device package including a first electrical redistribution structure and an embedded routing.

Referring to FIG. 21, an exemplary electronic device package 2100 is shown. The electronic device package 2100 is similar to the electronic device package 1500, and reference is made to the description thereof to avoid reiteration. As a difference to electronic device package 1500, the metal block 104 does not extend through the encapsulating material 106. The metal block 104 may be used to form an embedded routing in the encapsulating material 106. The thickness T1 of the metal block 104 may be equal to or less than 50%, 40%, 30%, 20%, or 10% of the thickness T3 of the encapsulating material 106.

Figure 22:
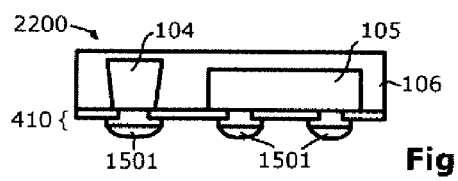
FIG. 22 schematically illustrates a cross-sectional view of an embodiment of an electronic device package including a first electrical redistribution structure and an embedded routing.

Referring to FIG. 22, an exemplary electronic device package 2200 is shown. The electronic device package 2200 is similar to the electronic device package 2100, and reference is made to the description thereof to avoid reiteration. The metal block 104 may be used to form an embedded routing in the encapsulating material 106. The thickness T1 of the metal block 104 may be equal to or greater than 50%, 60%, 70%, 80%, or 90% of the thickness T3 of the encapsulating material 106.

Figure 23:
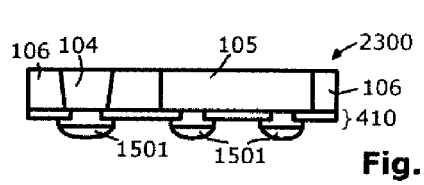
FIG. 23 schematically illustrates a cross-sectional view of an embodiment of an electronic device package including a first electrical redistribution structure and an exposed semiconductor chip and an exposed metal block.

Referring to FIG. 23, an exemplary electronic device package 2300 is shown. The electronic device package 2300 is similar to the electronic device package 1500, and reference is made to the description thereof to avoid reiteration. As a difference to electronic device package 1500, thinning may have been continued until both the metal block 104 and the semiconductor chip 105 are exposed. By way of example, the metal block 104 may have a thickness T1 identical with the thickness T2 of the semiconductor chip 105.

Figure 24:
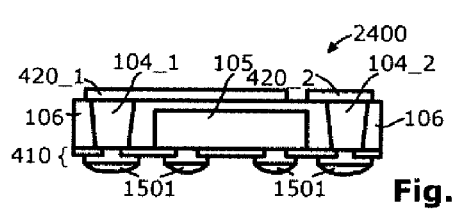
FIG. 24 schematically illustrates a cross-sectional view of an embodiment of an electronic device package including a first and a second electrical redistribution structure.

Referring to FIG. 24, an exemplary electronic device package 2400 is shown. The electronic device package 2400 is similar to the electronic device package 1700 in some aspects (e.g. first and second redistribution structures 410, 420, metal block 104 configured as a via), and reference is made to the description thereof to avoid reiteration. The electronic device package 2400 may comprise at least two metal blocks 104_1, 104_2 which may be arranged laterally next to both sides of the semiconductor chip 105. Further, the back side of the semiconductor chip 105 may be completely covered by the encapsulating material 106, the second redistribution structure 420 may comprise mutually disconnected parts 420_1 and 420_2, wherein each part 420_1, 402_2 may be electrically connected to a corresponding metal block 104_1, 104_2, respectively, but, e.g., not to semiconductor chip 105.

Figure 25:
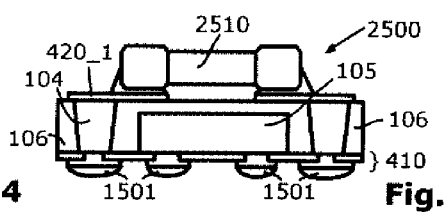
FIG. 25 schematically illustrates a cross-sectional view of an embodiment of an electronic device package including a first and a second electrical redistribution structure and a passive connected to the second electrical redistribution structure.

Referring to FIG. 25, an exemplary electronic device package 2500 is shown. The electronic device package 2500 is similar to the electronic device package 2400, and reference is made to the description thereof to avoid reiteration. Further, a passive 2510, e.g. inductor, resistor, or capacitor, may be mounted on the backside surface of the electronic device package 2500 and may be electrically connected to the package by the mutually disconnected parts 420_1 and 420_2 of the second redistribution structure 420.

Figure 26:
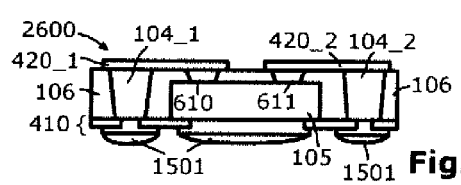
FIG. 26 schematically illustrates a cross-sectional view of an embodiment of an electronic device package including a first and a second electrical redistribution structure and an electronic component disposed in an face-up orientation in the electronic device package.

Referring to FIG. 26, an exemplary electronic device package 2600 is shown. The electronic device package 2600 is similar to the electronic device package 2400, and reference is made to the description thereof to avoid reiteration. As a difference to electronic device package 2400, the semiconductor chip 105 is positioned in the electronic device package 2600 in a face-up orientation. That is, electrodes 610, 611 of the semiconductor chip 105 may are facing the second redistribution structure 420 and may, e.g., be electrically interconnected with mutually disconnected parts 420_1 and 420_2 of the second redistribution structure 420. As has been described above by way of example, electrode 610 may, e.g., be a load electrode and electrode 611 may, e.g., be control electrode of the semiconductor chip 105.

Figure 27:
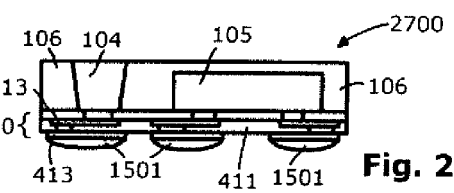
FIG. 27 schematically illustrates a cross-sectional view of an embodiment of an electronic device package including a first electrical redistribution structure comprising multiple electrical redistribution layers.

Referring to FIG. 27, an exemplary electronic device package 2700 is shown. The electronic device package 2700 is similar to the electronic device package 1500, and reference is made to the description thereof to avoid reiteration. As a difference to electronic device package 1500, the first redistribution structure 410 comprises a plurality of metal redistribution layers 413 and a plurality of insulating polymer layers 411 arranged between the metal redistribution layers 413.

Figure 28:
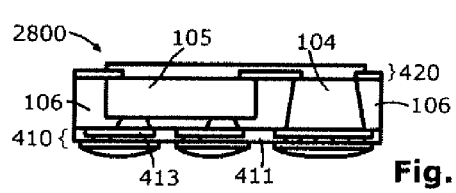
FIG. 28 schematically illustrates a cross-sectional view of an embodiment of an electronic device package including a first electrical redistribution structure comprising multiple electrical redistribution layers and a second electrical redistribution structure, wherein the first and second electrical redistribution structures are interchanged in position.

Referring to FIG. 28, an exemplary electronic device package 2800 is shown. The electronic device package 2800 may include, as a basic structure, the electronic device package 1400. Further, a first redistribution structure 410 and a second redistribution structure 420 are added. However, compared to other embodiments, basic structure (electronic device package 1400) may first be flipped and then, the first and second redistribution structures 410, 420 are applied. That way, as opposed to the orientation exemplified by electronic device package 2600, the first redistribution structure 410 may be connected to electrodes 610, 611 of the semiconductor chip 105 and the second redistribution structure 420 may be connected to a back side electrode (e.g. load electrode) of the semiconductor chip 105. It is to be noted that the concept of applying one or both of the first and second redistribution structures 410, 420 to the opposite side may be used in all other embodiments shown herein.

Figure 29:
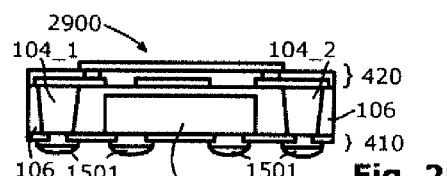
FIG. 29 schematically illustrates a cross-sectional view of an embodiment of an electronic device package including a first electrical redistribution structure and a second electrical redistribution structure comprising multiple electrical redistribution layers.

Referring to FIG. 29, an exemplary electronic device package 2900 is shown. The electronic device package 2900 is similar to the electronic device package 2400, and reference is made to the description thereof to avoid reiteration. As a difference to electronic device package 2400, the second redistribution structure 420 comprises a plurality of metal redistribution layers and a plurality of insulating polymer layers arranged between the metal redistribution layers.

Referring to FIG. 30, an exemplary electronic device package 3000 is shown. The electronic device package 3000 is similar to the electronic device package 2400, and reference is made to the description thereof to avoid reiteration. As a difference to semiconductor device package 2400, a continuous electrically conducting layer 3010 replaces the second redistribution structure 420. The continuous electrically conducting layer 3010 may, e.g., be a metal layer. It may be a metal layer deposited by any of the aforementioned techniques onto the back side of the electronic device package or it may be a metal foil laminated onto the back side of the electronic device package. The continuous electrically conducting layer 3010 may electrically connect to one or multiple (or, e.g., all) of the metal blocks 104_1, 104_2 of the electronic device package. The continuous electrically conducting layer 3010 may serve as a shielding of the device. The continuous electrically conducting layer 3010 may cover equal to or greater than 70%, 80%, 90%, or 95% of the back side surface area of the electronic device package 3000. As the metal blocks 104_1, 104_2 may be designed to laterally enclose or surround the semiconductor chip 105, an effective overall shielding may be obtained.

Referring to FIG. 31, an exemplary electronic device package 3100 is shown. The electronic device package 3100 is similar to the electronic device package 1500, and reference is made to the description thereof to avoid reiteration. As a difference to electronic device package 1500, one of the electrodes of the semiconductor chip 105 may be connected to the metal block 104. The connection may be implemented by a metal redistribution layer of the first redistribution structure 410. The metal block 104 may serve as an embedded heat sink of the electronic device package 3100. The metal block 104 may have one or two lateral dimensions equal to or greater than 20%, 30%, 40%, 50%, 60%, 70%, or 80% of the corresponding lateral dimension of the electronic device package 3100. Further, as exemplified by electronic device package 3100, a common solder deposit 1501 may be applied to the semiconductor chip electrode and the metal block 104.

It is to be noted that one or more of the various designs and functions of the metal blocks 104 (e.g. embedded routing, through hole, heat sink, shielding) may be provided in a single electronic device package. Further, as shown in FIG. 32, a through hole matrix made of metal blocks 104 may be included in any of the electronic device packages described herein. The through hole matrix may be a one dimensional matrix (i.e. a row of through holes) or a two dimensional matrix (i.e. a two dimensional pattern or grid of through holes).

FIG. 33 illustrates the through hole (or via) matrix of FIG. 32 when arranged between and interconnected to a first and second redistribution structure 410, 420. By way of example, the second redistribution structure is, e.g., a multi-layer redistribution structure 420.

Referring to FIG. 34, an exemplary electronic device package 3400 is shown. The electronic device package 3400 is similar to the electronic device package 1800, and reference is made to the description thereof to avoid reiteration. As a difference to the electronic device package 1800, the semiconductor chips 105_1 and 105_2 are oriented face-down and face-up, respectively. Further, the first and second electrical redistribution structures 410, 420 may be designed different than in electronic device package 1800, and reference is made aforementioned embodiments showing similar redistribution structure designs.

Figure 35:
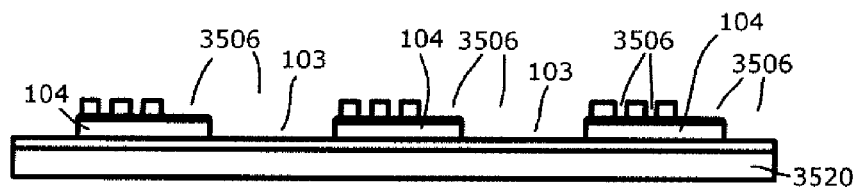
FIGS. 35A-35L schematically illustrate cross-sectional views of an embodiment of a method of manufacturing an electronic device package.
Figure 35:
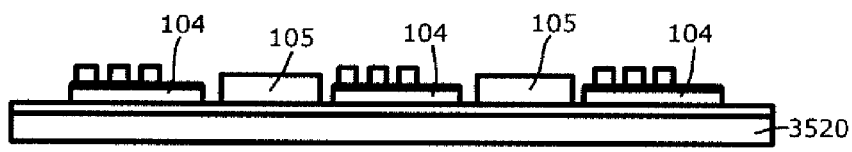
Figure 35:
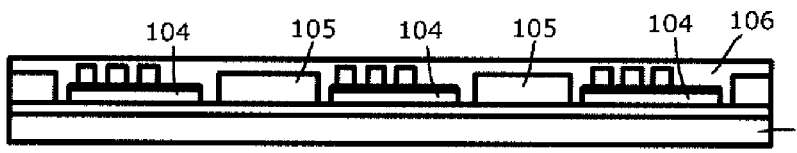
Figure 35:
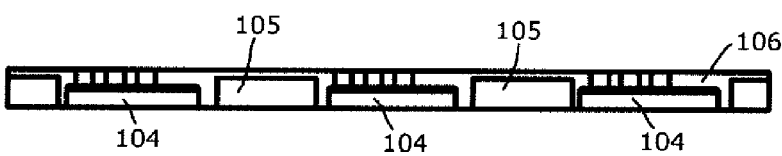
Figure 35:
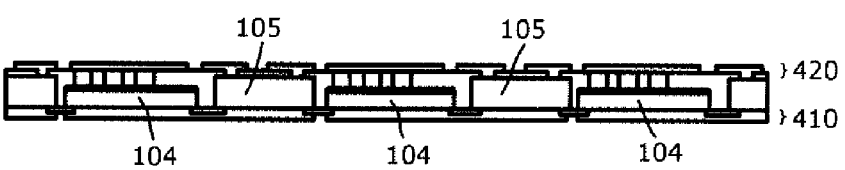
Figure 36:
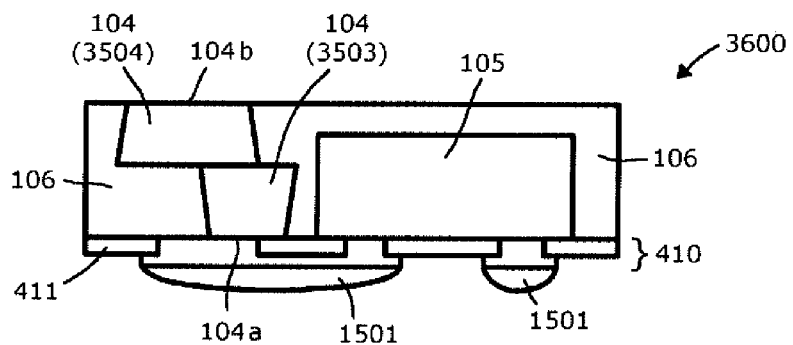
FIG. 36 schematically illustrates a cross-sectional view of an embodiment of an electronic device package.

FIGS. 35A-35L schematically illustrate cross-sectional views of an exemplary embodiment of a method of manufacturing an electronic device package, e.g. an electronic device package as shown in FIG. 36. Referring to FIG. 35A, a metal layer 3501 is provided. The metal layer 3501 may be the same as the metal layer 101 except that the metal layer 3501 comprises an internal etch stop layer 3502. The etch stop layer 3502 may continuously extend inside the metal layer 3501. By way of example, the metal layer 3501 may comprise or consists of the etch stop layer 3502 sandwiched between an upper metal layer (e.g. a metal foil) 3503 and a lower metal layer (e.g. a metal foil) 3504. The upper and the lower metal layers 3503, 3504 may, e.g., be of bulk metal, e.g. Cu, etc.

Referring to FIGS. 35B-35D, the upper metal layer 3503 is structured. By way of example, a photoresist layer 3510 is applied over the upper metal layer 3503 (FIG. 35B) and photolithography is performed as, e.g., described above to structure the photoresist layer 3510 into an etch mask (FIG. 35C).

Referring to FIG. 35D, the upper metal layer 3503 may then be structured by, e.g., an etching process to form a plurality of recesses 3505 therein. In view of the structuring process, reference is made to the above description. The structuring process may stop at the etch stop layer 3502. Etch stop layer 3502 may be an electrically conducting or an electrically insulating layer.

Referring to FIG. 35E, the partly structured metal layer 3501 may be flipped and transferred to a temporary carrier 3520. The temporary carrier 3520 may be the same as, e.g., the temporary carrier 302 (see FIG. 3C) and reference is made to the above description.

Referring to FIGS. 35F-35H, the (previously lower, now upper) metal layer 3504 is structured. By way of example, a photoresist layer 3511 may be applied over the metal layer 3504 (FIG. 35F) and the photolithography is performed, e.g., as described above to structure the photoresist layer 3511 into an etch mask (FIG. 35G).

Referring to FIG. 35H, the metal layer 3504 may then be structured by, e.g., an etching process to form a plurality of recesses 3506 therein, wherein at least some of the recesses 3505, 3506 in the metal layers 3503, 3504 combine to openings 103 penetrating the metal layer 3501. In view of features of the structuring process and features of the openings 103 formed in the metal layer 3501, reference is made to the above description. The structuring process may stop at etch stop layer 3502. The structure applied to the metal layer 3504 may be different from the structure applied to the metal layer 3503. In particular, the structure applied to the metal layer 3504 may be of different geometrical shape or outline than the structure applied to the metal layer 3503.

Generally spoken, the two side structuring process provides the opportunity to manufacture metal blocks 104 that have different shape on top and bottom side, e.g. the top and bottom sides may be of different geometrical shape or outline shape. By way of example, this might allow to have, e.g., more space for electrically routing on one side but at the same time to have large contact area on the other side.

FIG. 35I illustrates a process of placing electronic components 105 into at least some of the openings 103. Reference is made to the above description in order to avoid reiteration.

Referring to FIGS. 35J-35K, the encapsulation body 106 may be applied and an optional thinning process may be performed. Reference is made to the previous description, see, e.g., the disclosure in conjunction with FIGS. 1D, 2B, 3F, 4D, 4E, 5E, 5F, etc.

Referring to FIG. 35L, one or more redistribution layers 410 and/or 420 may be applied to one or both sides of the encapsulation body 107. Reference is made to the previous description of redistribution layers 410, 420, see, e.g., the disclosure in conjunction with FIGS. 4F-4H, 5G-5I, etc.

It is to be noted that the process of using one temporary carrier 3520 as illustrated by way of example in FIGS. 35E-35J may be replaced by a process using multiple (e.g. two) temporary carriers as illustrated by way of example in FIGS. 3A-3F and 5A-5F. That way, the placing process and the orientation of the metal blocks 104 relative to the electronic components 105 may be devised more flexible.

FIG. 36 schematically illustrates a cross-sectional view of an embodiment of an electronic device package 3600. The electronic device package 3600 may, e.g., be fabricated by a process comprising process stages as illustrated in FIGS. 35A-35J.

More specifically, the metal block 104 may have an upper side surface 104b shape designed different than and, e.g., independent from the lower side surface 104a shape. This additional degree of design variability allows tailoring the metal block's shape to match to different needs and/or functionalities of the electronic device package 3600 and/or the designs of the redistribution layers 410, 420. By way of example, if the one side's functionality is mainly to provide for efficient heat dissipation and/or the other side's functionality is mainly to provide for internal or external electrical rerouting and/or external connectivity (e.g. by the provision of external terminals of the electronic device package 3600), these functionalities may map into the individual shapes/outlines of the both sides or surfaces 104a, 104b of the metal block 104. In particular, the upper part of the metal block 104 (e.g. made from the metal layer 3504) may be laterally displaced relative to the lower part of the metal block 104 (e.g. made of the metal layer 3503). As to other features, dimensions, functions, materials, etc. of the electronic device package 3600 and its various parts, reference is made to the embodiments and design variations described herein to avoid reiteration.

Although specific implementations have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention may be limited only by the claims and the equivalents thereof.

What is claimed is:

1. An electronic device package, comprising:
   at least one metal block formed of an integral piece of metal, the at least one metal block having a first surface and a second surface opposite the first surface;
   at least one semiconductor chip arranged laterally adjacent to the at least one metal block, the at least one semiconductor chip having a first surface and a second surface opposite the first surface;
   an encapsulant embedding the at least one metal block and the at least one semiconductor chip;
   a first electrical redistribution structure over the first surface of the at least one semiconductor chip and the first surface of the at least one metal block, the first electrical redistribution structure being electrically connected to the at least one metal block and an electrode arranged on the first surface of the at least one semiconductor chip; and
   a second electrical redistribution structure over the second surface of the at least one semiconductor chip and the second surface of the at least one metal block, the second electrical redistribution structure being electrically connected to the at least one metal block and to an electrode on the second surface of the at least one semiconductor chip, wherein the at least one metal block comprises at least one L-shaped block segment, the at least one L-shaped block segment having a first arm and a second arm, the first arm extends laterally opposite a first side face of the at least one semiconductor chip and the second arm extends laterally opposite a second side face of the at least one semiconductor chip, wherein the first surface of the at least one semiconductor chip levels with the first surface of the at least one metal block.

2. The electronic device package of claim 1, wherein the second surface of the at least one metal block penetrates the encapsulant.

3. The electronic device package of claim 1, wherein the at least one metal block has a thickness equal to or greater than the thickness of the at least one semiconductor chip.

4. The electronic device package of claim 1, wherein the at least one metal block has tapered side faces.

5. The electronic device package of claim 1, wherein the first surface and the second surface of at least one metal block are different in shape.

6. An electronic device package, comprising:
at least one metal block formed of an integral piece of metal, the at least one metal block having a first surface and a second surface opposite the first surface;
at least one semiconductor chip arranged laterally adjacent to the at least one metal block, the at least one semiconductor chip having a first surface and a second surface opposite the first surface and four side faces connecting the first surface and the second surface; and
an encapsulant embedding the at least one metal block and the at least one semiconductor chip,
wherein the at least one metal block comprises a T-shaped block segment, the T-shaped block segment having a beam, and a leg,
wherein the metal block borders on solely three of the four side faces of the at least one semiconductor chip, and
wherein the beam essentially extends along the whole length of a first side face of the electronic device package and wherein the leg is arranged centrally in the electronic device package and essentially extends from the first side face to an opposite second side face of the electronic device package.

7. The electronic device package of claim 6, wherein the percentage in volume of the metal block material embedded in the encapsulant is greater than the percentage in volume of semiconductor chip material embedded in the encapsulant.

* * * * *